United States Patent
Ouchi

(10) Patent No.: US 8,581,403 B2
(45) Date of Patent: Nov. 12, 2013

(54) ELECTRONIC COMPONENT MOUNTING STRUCTURE, ELECTRONIC COMPONENT MOUNTING METHOD, AND ELECTRONIC COMPONENT MOUNTING BOARD

(75) Inventor: Akira Ouchi, Tokyo (JP)

(73) Assignee: NEC Corporation, Tokyo (JP)

( * ) Notice: Subject to any disclaimer, the term of this patent is extended or adjusted under 35 U.S.C. 154(b) by 458 days.

(21) Appl. No.: 12/863,941

(22) PCT Filed: Jan. 13, 2009

(86) PCT No.: PCT/JP2009/050270
§ 371 (c)(1),
(2), (4) Date: Jul. 21, 2010

(87) PCT Pub. No.: WO2009/096216
PCT Pub. Date: Aug. 6, 2009

(65) Prior Publication Data
US 2010/0295177 A1    Nov. 25, 2010

(30) Foreign Application Priority Data
Jan. 30, 2008 (JP) .................. 2008-019966

(51) Int. Cl.
*H01L 23/48* (2006.01)

(52) U.S. Cl.
USPC ............... 257/738; 257/778; 257/E21.503; 257/E23.021; 257/E23.004; 438/108; 438/613

(58) Field of Classification Search
USPC .......... 257/737, 738, E21.508, E21.021, 778, 257/E21.503, E23.021, E23.004; 438/108, 438/613
See application file for complete search history.

(56) References Cited

U.S. PATENT DOCUMENTS

| | | | |
|---|---|---|---|
| 6,413,799 B1* | 7/2002 | Lam .............................. | 438/113 |
| 6,563,225 B2* | 5/2003 | Soga et al. ................... | 257/782 |
| 6,590,287 B2* | 7/2003 | Ohuchi ......................... | 257/738 |
| 6,798,072 B2* | 9/2004 | Kajiwara et al. .............. | 257/778 |
| 6,909,054 B2* | 6/2005 | Sakamoto et al. ............ | 174/260 |

FOREIGN PATENT DOCUMENTS

| | | |
|---|---|---|
| JP | 6-326108 A | 11/1994 |
| JP | 8-203961 A | 8/1996 |
| JP | 11-233558 A | 8/1999 |

(Continued)

OTHER PUBLICATIONS

English translation of WO2006/057360.*

(Continued)

*Primary Examiner* — John C Ingham

(57) ABSTRACT

In an electronic component mounting structure, a semiconductor element (an electronic component) provided with an electrode pad and a board provide with an electrode pad corresponding to the electrode pad are connected via a conductive material portion. On a surface of the board, there is formed solder resist having an opening regulating an area of the electrode pad. The conductive material portion is formed to protrude from a surface of the solder resist. An elastic coefficient of the conductive material portion is lower than that of the solder resist. A solder bump and the conductive material portion are connected via a metal layer. The conductive material portion is formed to have an area larger than that of the opening of the solder resist. An edge of the conductive material portion is adhered to a portion of the surface of the solder resist. Thus, in a case of mounting an electronic component on a board by flip-chip connection, a reliability of connection can be secured.

20 Claims, 9 Drawing Sheets

(56) References Cited

FOREIGN PATENT DOCUMENTS

| | | | |
|---|---|---|---|
| JP | 2000077558 A | 3/2000 | |
| JP | 2001185577 A | 7/2001 | |
| JP | 2001298111 A | 10/2001 | |
| JP | 2003092306 A | 3/2003 | |
| JP | 2005303021 A | 10/2005 | |
| WO | 2006057360 A | 6/2006 | |

OTHER PUBLICATIONS

International Search Report for PCT/JP2009/050270 mailed Apr. 14, 2009.

* cited by examiner

ELECTRONIC COMPONENT MOUNTING STRUCTURE, ELECTRONIC COMPONENT MOUNTING METHOD, AND ELECTRONIC COMPONENT MOUNTING BOARD

This application is the National Phase of PCT/JP2009/050270, filed Jan. 13, 2009, which is based upon and claims the benefit of priority from Japanese Patent Application No. 2008-019966, filed on Jan. 30, 2008, the disclosure of which is incorporated herein its entirely by reference.

TECHNICAL FIELD

The present invention relates to an electronic component mounting structure, an electronic component mounting method, and an electronic component mounting board.

BACKGROUND ART

As representative electronic components, there are known semiconductor elements such as a bare chip, a CSP (Chip-sized Package) and a BGA (Ball Grid Array) that are widely used in various kinds of electronic equipments. As electronic equipments rapidly develop, such semiconductor elements are required to have higher function than before. As a semiconductor element has higher function, a multi-pin configuration is required in accordance with increase in the number of input and output terminals of the semiconductor element, and a reduction in length of a signal transmission wiring is required in order to achieve a high-speed operation of the semiconductor element. A flip-chip connection is known as a mounting technique developed for accomplishing these requirements.

The flip-chip connection is suitable for the multi-pin configuration because many electrode pads can be provided on an area of a wiring plane of a semiconductor element. Moreover, as compared with other connection methods such as wire bonding and tape automated bonding, according to the flip-chip connection, the electrode pad of the semiconductor element is directly connected to a pad of a board via a brazing material protruding portion such as solder bump without requiring a lead line, and therefore, a wiring length can be reduced. Because of the reasons as mentioned above, cases have increased in which the flip-chip connection is used us a mounting technique of a semiconductor element in an electronic equipment.

At present, solder and Au are generally used as material of a brazing material protruding portion for mounting a semiconductor element onto a board with use of the flip-chip connection. It is noted here that, although Sn—Pb eutectic solder is widely used as a specific material of the solder, the material of the solder is not limited to the Sn—Pb eutectic solder. Other materials such as Sn—Pb (excluding the eutectic solder), Sn—Ag, Sn—Cu, Sn—Zn and Sn—Bi can be used, and further these materials added with a specific additional element such as Ni, Ge and the like can be listed, and one of these materials can be properly selected in accordance with a purpose.

Meanwhile, in many cases of the flip-chip connection of semiconductor element, underfill resin is filled in a gap between a semiconductor element and a board in order to relieve a stress due to a difference in thermal expansion coefficient between the semiconductor element and the board. Thus, reliability of connection can be secured. A mounting structure like this is disclosed in, e.g., Japanese patent publication (JP-A-Heisei 11-233558). Another mounting structure is disclosed in Japanese patent publication (JP-A-Heisei 08-203961) as shown in FIG. 1. In this mounting structure, a conductive metal layer 124 is formed on a surface of a low elastic coefficient layer of a first adhesive layer 123 disposed on an electrode 125 on a board 126 side, and the metal layer 124 is connected with an electrode 121 on a semiconductor element 120 side. This connection is kept with use of a second adhesive layer 122.

Further, in a mounting structure disclosed in Japanese patent publication (JP-P2001-185577A) as shown in FIG. 2, a bump 132 is formed on a metal pad 131 of a semiconductor package main body 130, and a metal layer 134 having a melting point lower than that of the bump 132 is formed on an electrode terminal 135 of a board 136, and the bump 132 and the electrode terminal 135 are connected with each other via a conductive adhesive layer 133. Further, in Japanese patent publication (JP-P2000-077558A), there is disclosed a printed wiring board having BGA connection electrodes. Conductive resin is filled into a thorough hole formed in an insulating board from a side of the thorough hole, a BGA connection electrode integrally formed with the same material as that of the conductive resin is provided at the other side of the through hole, and solder resist is formed on at least one surface of the insulating board.

By the way, in the semiconductor element mounting structure disclosed in Japanese patent publication (JP-A-Heisei 11-233558), underfill resin is filled in a gap between the semiconductor element and the board in order to relieve a high stress which is caused by a difference in thermal expansion coefficient between the semiconductor element and the board and which is applied to the solder bump having a high elastic coefficient. However, since a concentrated stress is applied at a connection portion of the bump in a process before filling the resin, it is necessary to take measures against the stress in a manufacturing process. This problem becomes still more serious when a number of products is increased to which a Pb-free solder bump having a high elastic coefficient is applied or when a number of products is increased in which a low-k film (low conductivity film) having a low mechanical strength is used for a chip. Also, even after the underfill resin is filled, an elastic coefficient of the solder bump is much higher than that of the underfill resin. For example, whereas the elastic coefficient of the solder bump of Ag (3 wt % (weight percentage))—Cu (0.5 wt %)—Sn (balance) is approximately 40 GPa (Giga Pascal), the elastic coefficient of the underfill resin is about 10 GPa even in the case of increasing the elastic coefficient by mixing filler thereto. Therefore, there may be a case where the concentrated stress is still applied to the soldering connection portion having a high elastic coefficient, a crack occurs in the solder bump, or a chip or board in the vicinity of the connection portion thereof due to repeated temperature change or the like, the connection reliability cannot be secured as a result.

Therefore, as a trial of lowering an elastic coefficient of a bump joint portion, Japanese patent publication (JP-A-Heisei 08-203961) suggests the structure as shown in FIG. 1 wherein the conductive metal layer 124 is formed surrounding the low elastic coefficient layer of the first adhesive layer 123 on the board side such that the conductive metal layer 124 and the electrode 121 on the semiconductor element side are connected to each other via the second adhesive layer 122. In this case, it is possible to reduce the stress applied to the bump connection portion by using the first adhesive layer 123 having a low elastic coefficient. In this method, however, since the bump 121 on the semiconductor element side is connected with the electrode 125 on the board side via the second adhesive layer 122, it is necessary to strictly control the quantity of the second adhesive layer 122 to be supplied to the respective electrodes 121 and 125. When the quantity of the second adhesive layer 122 is small, it results in a poor connection of the bump. When the quantity is excessive, an excessive adhesive layer spreads from the bump connection portion, which may highly possibly result in a short circuit failure in which neighboring bumps are connected to each other. Moreover, it is necessary to secure the connection by applying some degree of load between the semiconductor element and the board at the mounting of the semiconductor element, and it is a structure in which the first adhesive layer 123 formed on the board side is deformed to be spread at the application of the load and a short circuit failure easily occurs. In view of the above, there is a problem that it is difficult to be applied to a fine pitch structure, and the connection reliability is lowered similarly to the technique disclosed in Japanese patent publication (JP-A-Heisei 11-233558).

In the mounting structure disclosed in Japanese patent publication (JP-P2001-185577A) as shown in FIG. 2, the metal layer 134 having a melting point lower than that of the bump 132 is formed on the electrode terminal 135 of the board 136, and the bump 132 and the electrode terminal 135 are connected with each other via the conductive adhesive layer 133. Hence, when the semiconductor package main body 130 is required to be removed, the semiconductor package main body 130 can be easily removed merely by melting the metal layer 134 of a low melting point, and therefore a purpose of facilitating a rework can be attained. In this mounting structure, since the bump 132 and the electrode terminal 135 are connected with each other via the conductive adhesive layer 133, it is required to take long time to cure the conductive adhesive layer 133 at the connecting. Also, it is necessary to hold the load applied to the semiconductor package main body 130 until the conductive adhesive layer 133 is cured. Unless such processes are carried out, not only the connection reliability is lowered but also a productivity including a connection yield is deteriorated. Japanese patent publication (JP-P2000-077558A) merely discloses the printed wiring board having BGA connection electrodes but does not disclose a mounting structure for flip-chip connecting a semiconductor element to a board.

SUMMARY OF INVENTION

The present invention provides an electronic component mounting structure, an electronic component mounting method and an electronic component mounting board that can secure connection reliability when an electronic component is mounted onto a board by a flip-chip connection.

In a first aspect of the present invention, an electronic component mounting structure is provided in which an electronic component provided with a first electrode pad and a board provided with a second electrode pad corresponding to the first electrode pad are arranged such that the first electrode pad and the second electrode pad are opposed to each other. A brazing material protruding portion is formed on a surface of the first electrode pad. The first electrode pad and the second electrode pad are connected via the brazing material protruding portion and a conductive adhesive layer which is formed to be in contact with the second electrode pad. Solder resist is formed on a surface of the board. The solder resist has an opening defining an area of the second electrode pad. The conductive adhesive layer being in contact with the second electrode pad is formed to protrude from a surface of the solder resist. An elastic coefficient of the conductive adhesive layer is lower than that of the solder resist.

In a second aspect of the present invention, an electronic component provided with a first electrode pad and a board provided with a second electrode pad corresponding to the first electrode pad are arranged such that the first and second electrode pads are opposed to each other. An electronic component mounting method in which the first electrode pad and the second electrode pad are connected by brazing, includes: a step of forming a brazing material protruding portion on a surface of the first electrode pad; a step of forming the second electrode pad on a surface of the board after forming solder resist having an opening on the surface of the board, wherein an area of the second electrode pad is defined by the opening; a step of forming a conductive adhesive layer such that the conductive adhesive layer is in contact with the second electrode pad, extends from the opening to a portion of a surface of the solder resist and protrudes from the surface of the solder resist, wherein the conductive adhesive layer is lower than the solder resist in elastic coefficient; and a step of connecting the brazing material protruding portion to the conductive adhesive layer by melting the brazing material protruding portion after arranging and mounting the electronic component on the board.

In a third aspect of the present invention, there is provided an electronic component mounting board for arranging an electronic component provided with a first electrode pad and a board provided with a second electrode pad corresponding to the first electrode pad such that the first electrode pad and the second electrode pad are opposed to each other and for connecting the first electrode pad and the second electrode pad to each other by brazing. Solder resist having an opening defining an area of the second electrode pad is formed on a surface of the board. A conductive adhesive layer is formed to be in contact with the second electrode pad and protrude from a surface of the solder resist. An elastic coefficient of the conductive material is lower than that of the solder resist.

As described above, according to a configuration of the present invention, the conductive adhesive layer 6 is lower than the solder resist 8 in elastic coefficient and protrudes from the surface of the solder resist 8, whereby the conductive adhesive layer 6 can be freely deformed to absorb a horizontal thermal distortion caused by a difference in thermal expansion coefficient between the semiconductor element 1 and the board 2 to thereby provide a high stress-relieving effect. Moreover, since the conductive adhesive layer 6 is formed to have an area larger than the opening 8A of the solder resist 8 such that an edge 6A of the conductive adhesive layer 6 is adhered to a portion of the surface of the solder resist 8, plating solution is prevented from penetrating into a junction interface between the conductive adhesive layer 6 and the electrode pad 4 in a plating process of forming the metal layer 7 on the surface of the conductive adhesive layer 6. This suppresses bad influences, which are caused by an influence of the plating solution, such as reduction in adhesion strength and a rise in conduction resistance at the junction interface between the conductive adhesive layer 6 and the electrode pad 4, and therefore it is possible to keep a good conduction at the junction interface between the conductive adhesive layer 6 and the electrode pad 4 and to increase a degree of freedom in selecting plating solution. Furthermore, since the adhesion area between the conductive adhesive layer 6 and the solder resist 8 is increased, the adhesion strength of the conductive adhesive layer 6 can be improved. In addition, since the connection between the electronic component 1 and the board 2 is made as a soldering connection by forming the metal layer 7 on the surface of the conductive adhesive layer 6, a solder bump 5 on the electronic component 1 side is melt and spread to wet the metal layer 7 formed on the surface of the conductive adhesive layer 6 on the board 2 side. Accordingly, not only a stable shape of the bump is obtained by a surface tension of the solder after the mounting, but also it is not necessary to apply a load especially at the mounting, and therefore the conductive adhesive layer 6 having a low elastic coefficient is not deformed and occurrence of an inter-bump short circuit is suppressed, which is also effective for a fine pitch configuration.

DESCRIPTION OF EMBODIMENT

Figure 1:
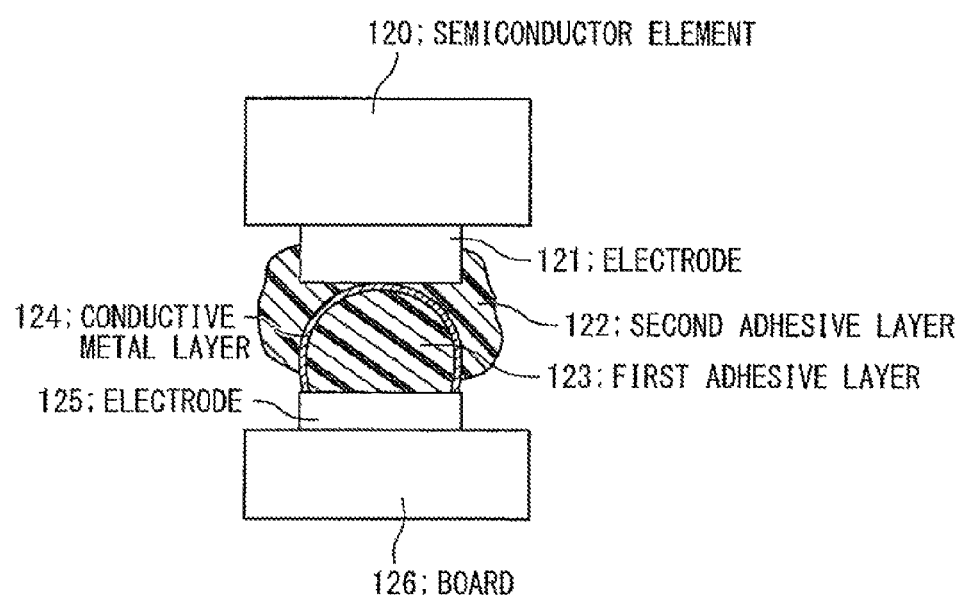
FIG. 1 is a cross-sectional view showing a conventional electronic component mounting structure.
Figure 2:
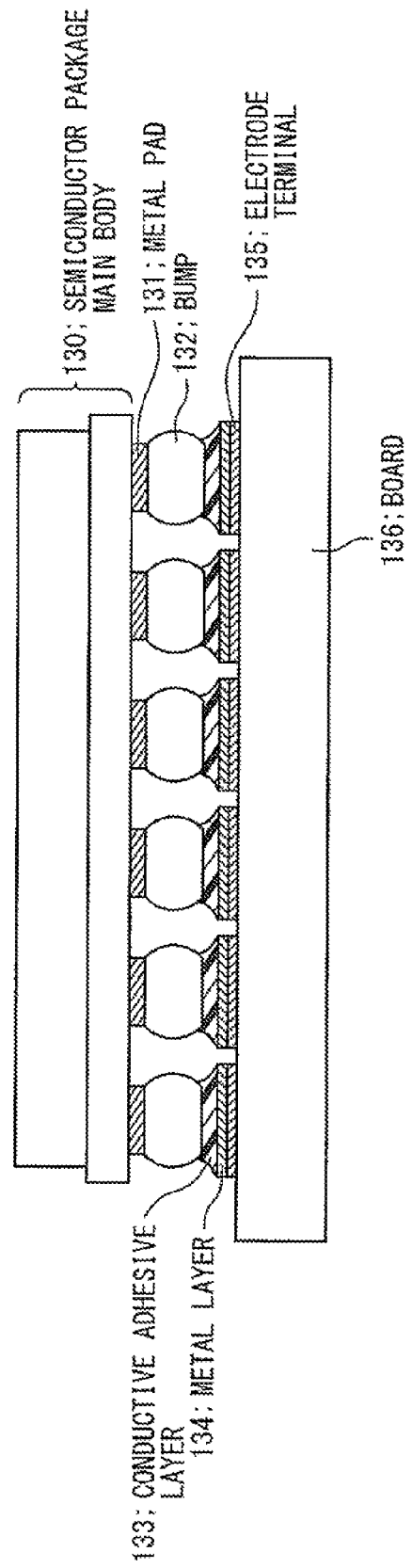
FIG. 2 is a cross-sectional view showing another conventional electronic component mounting structure.

Referring to the accompanying drawings, an electronic component mounting structure according to the present invention will be described below. In an electronic component mounting structure 10 according to the present invention, a semiconductor element (electronic component) provided with electrode pads 3 and a board 2 provided with electrode pads 4 corresponding to the electrode pads 3 are arranged such that the electrode pads 3 and the electrode pads 4 are respectively opposed to each other. A solder bump 5 is formed on a surface of the electrode pad 3, and the electrode pad 3 and the electrode pad 4 are connected via a conductive adhesive layer 6 contacting the solder bump 5 and the electrode pad 4. Solder resist 8 having an opening 8A regulating an area of the electrode pad 4 is formed on a surface of the board 2, and the conductive adhesive layer 6 is formed to protrude from a surface of the solder resist 8. The conductive adhesive layer 6 has an elastic coefficient lower than that of the solder resist 8. The solder bump 5 and the conductive adhesive layer 6 are connected via a metal layer 7, the conductive adhesive layer 6 is formed to have an area larger than that of the opening 8A of the solder resist 8, and an edge 6A of the conductive adhesive layer 6 is adhered to a portion of the surface of the solder resist 8.

Figure 3:
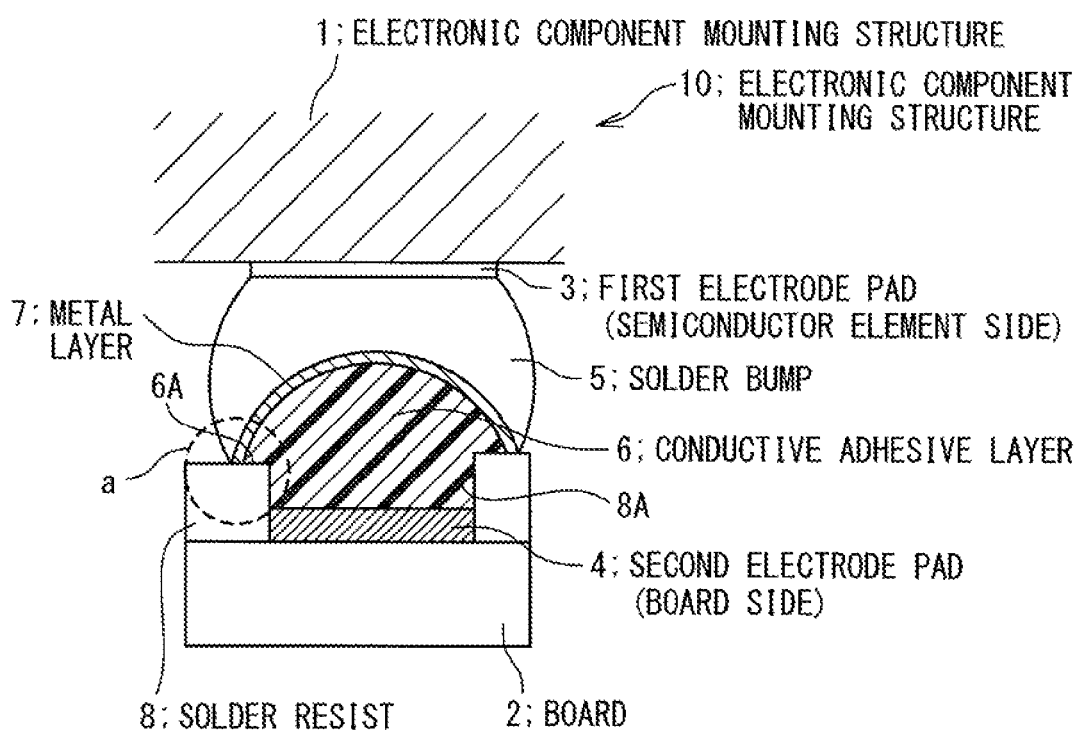
FIG. 3 is a cross-sectional view showing an electronic component mounting structure according to a first exemplary embodiment of the present invention.
Figure 4:
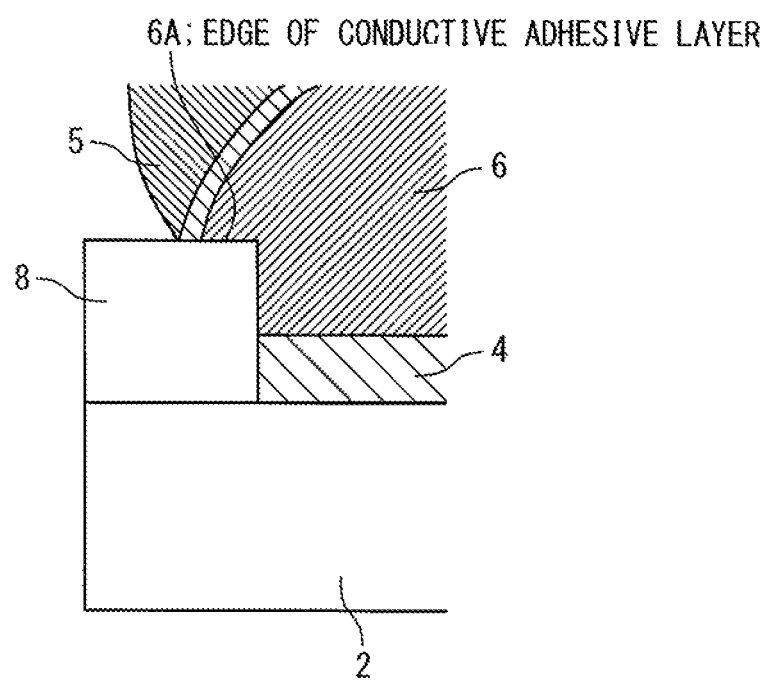
FIG. 4 is a cross-sectional view showing an enlarged structure of a portion of FIG. 3.
Figure 5A:
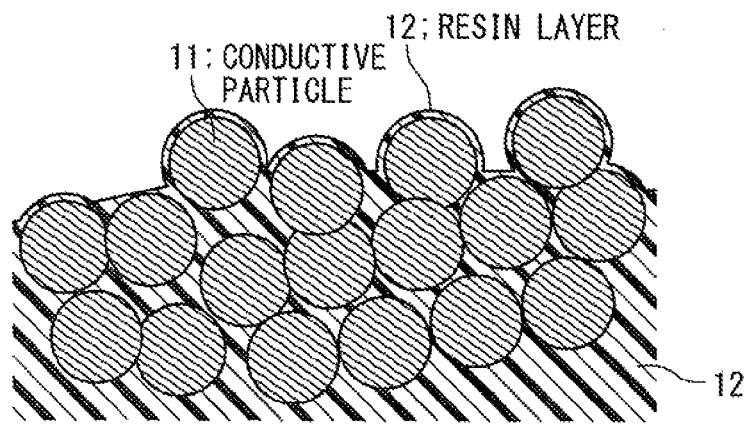
FIG. 5A shows a state in which a resin layer is formed on surfaces of conductive particles on a surface of a conductive adhesive layer in the electronic component mounting structure.
Figure 5B:
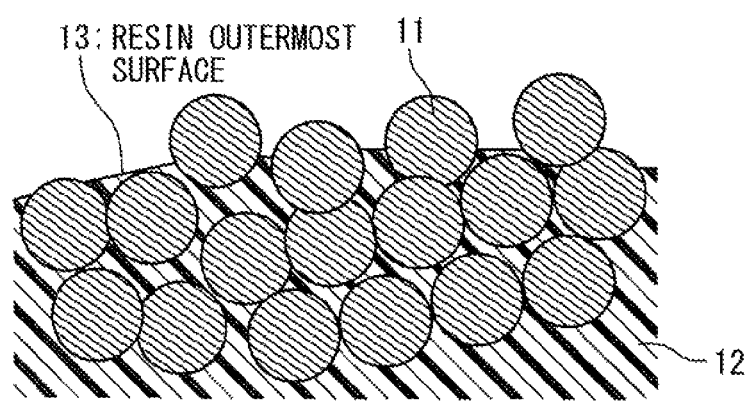
FIG. 5B is a schematic diagram showing a state of the surface of the conductive adhesive layer in the electronic component mounting structure.
Figure 5C:
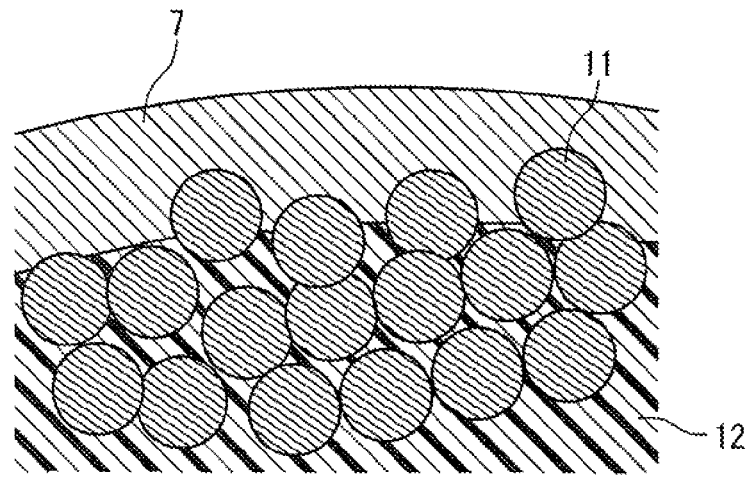
FIG. 5C is shows a state of adhesion between the surface of the conductive adhesive layer and a metal layer in the electronic component mounting structure.

FIG. 3 is a cross-sectional view showing an electronic component mounting structure according to a first exemplary embodiment of the present invention. FIG. 4 is a partial enlarged cross-sectional view of FIG. 3. FIG. 5A shows a state in which a resin layer is formed on surfaces of conductive particles on a surface of a conductive adhesive layer in the electronic component mounting structure, FIG. 5B shows a state of the surface of the conductive adhesive layer in the electronic component mounting structure, and FIG. 5C shows a state of adhesion between the surface of the conductive adhesive layer and a metal layer in the electronic component mounting structure.

Referring to FIG. 3, in the electronic component mounting structure 10 according to the first exemplary embodiment, a semiconductor element (electronic component) 1 provided with a first electrode pad 3 made of e.g. Al and a board 2 provided with a second electrode pad 4 made of e.g. Cu corresponding to the first electrode pad 3 are arranged such that the first electrode pad 3 and the second electrode pad 4 are opposed to each other. A solder bump (conductive brazing material protruding portion) 5 is formed on a surface of the first electrode pad 3, and the electrode pad 3 and the electrode pad 4 are connected via the conductive adhesive layer 6 to the solder bump 5 and the electrode pad 4. Solder resist 8 having an opening 8A regulating an area of the second electrode pad 4 is formed on a surface of the board 2, and the conductive adhesive layer 6 in contact with the second electrode pad 4 is formed to protrude from a surface of the solder resist 8. The conductive adhesive layer 6 has an elastic coefficient lower than that of the solder resist 8. The solder bump 5 and the conductive adhesive layer 6 are connected via a metal layer 7. In addition, as shown in FIG. 4, the conductive adhesive layer 6 is formed to have an area larger than that of the opening 8A of the solder resist 8, and an edge 6A of the conductive adhesive layer 6 is adhered to a portion of the surface of the solder resist 8.

As described above, the area of the second electrode pad 4 on the surface of the board 2 is basically defined by the opening 8A of the solder resist 8. However, in some cases, the area of the second electrode pad 4 may not be in agreement with that of the opening 8A and the area of the second electrode pad 4 may be smaller than that of the opening 8A.

As a concrete material of the solder bump 5, Sn/Pb, Sn/Ag, Sn/Cu, Sn/Zn and Sn/Bi can be used, and further these materials added with a specific additional element such as Ni, Ge and the like can be listed, and these materials are appropriately used. As a method of forming the solder bump 5, there is a method in which solder paste containing flux is printed onto the electrode pad 3 by using a metal mask and the flux is washed after reflowing. Alternatively, there may be used a method in which a solder ball is transferred to the flux coated electrode pad 3 and the flux is washed after solder reflowing. The solder resist 8 with a thickness of 15 to 40 μm is formed on the surface of the board 2 except for a place in which the electrode pad 4 is formed as described above. The solder resist 8 has a function of masking places in which soldering is not required and preventing the solder from spreading. In the case of performing the connection using the solder bump 5 as described with respect to the mounting structure according to the first exemplary embodiment, the solder resist 8 is important for preventing a short circuit between the solder bumps 5 adjacent to each other.

Thermosetting epoxy resin is generally used as a material of the solder resist 8. In an example of a method of forming the solder resist 8, the solder resist 8 of liquid state is spread on the surface of the board 2 by a screen printing method or the like, and a portion corresponding to the electrode pad is opened by performing exposure and development. Thereafter, the solder resist is formed by ultraviolet curing or heat curing. The elastic coefficient of the solder resist 8 is generally 2 to 3 GPa although it differs according to kinds of the materials. As described above, the conductive adhesive layer 6 is formed on the electrode pad 4 of the board 2. In an example of a method of forming the conductive adhesive layer 6, the conductive adhesive layer 6 is selectively formed on the electrode pad 4 by a printing method using a metal mask and is then cured under a predetermined condition.

It is desirable that the conductive adhesive layer 6 is strongly adhered to the electrode pad 4, and therefore it is necessary to select conductive resin to be used, which is adhesive as high as possible. It is also effective to roughen the surface of the electrode pad 4 in a degree of some microns order for ensuring adhesion strength. It is necessary that the conductive adhesive layer 6 should have an elastic coefficient lower than that of the solder resist 8 and protrude from the surface of the solder resist 8. The conductive adhesive layer 6 has a function of relieving a thermal stress caused by a difference in thermal expansion coefficient between the semiconductor element 1 and the board 2, and therefore the conductive adhesive layer 6 has an elastic coefficient lower than that of the solder resist 3 and protrude from the surface of the solder resist 8. Thus, the conductive adhesive layer 6 can be freely deformed to absorb the horizontal thermal distortion caused by the difference in thermal expansion coefficient between the semiconductor element 1 and the board 2, thereby providing a high stress-relieving effect. It is desirable that a protruding height of the conductive adhesive layer 6 from the surface of the solder resist 8 is varied according to the area of the second electrode pad 4. This is because it is hard to obtain the stress-relieving effect if the protruding height is low, whereas it is difficult to efficiently form a bump electrode having a good productivity if the protruding height is high.

For example, if a plane shape of the second electrode pad 4 is almost circular, it is desirable that the protruding height of the conductive adhesive layer 6 from the surface of the solder resist 8 is selected to be 10 to 50% of a diameter of the second electrode pad 4. Here, the diameter of the second electrode pad 4 is selected to be 0.08 to 0.15 mm in a case of a bare chip, 0.15 to 0.3 mm in a case of a CSP, and 0.9 to 0.6 mm in a case of a BCA.

As shown in FIG. 4, the shape of a portion of the conductive adhesive layer 6 formed on the surface of the solder resist 8 is formed to have an area larger than that of the opening 8A of the solder resist 8. It is important that the edge 6A of the conductive adhesive layer 6 is adhered to a portion of the surface of the solder resist 8. Since the edge 6A of the conductive adhesive layer 6 is adhered to the portion of the surface of the solder resist 8, as described below, plating solution is prevented from penetrating into a junction interface between the conductive adhesive layer 6 and the electrode pad 4 in a plating process for forming the metal layer 7 on the surface of the conductive adhesive layer 6. This is effective to suppress bad influences, which are caused by an influence of the plating solution, such as reduction in adhesion strength and a rise in conduction resistance at the junction interface between the conductive adhesive layer 6 and the electrode pad 4, and therefore it is possible to keep a good conduction at the junction interface between the conductive adhesive layer 6 and the electrode pad 4. Thus, it is possible to increase a degree of freedom in selecting plating solution. Furthermore, since the adhesion area between the conductive adhesive layer 6 and the solder resist 8 is increased, the adhesion strength of the conductive adhesive layer 6 can be improved.

Here, the area of the conductive adhesive layer 6 is equal to or smaller than 1.5 times the area of the electrode pad 4 on the board 2 side (i.e., corresponding to the area of the opening 8A of the solder resist), for example. In view of protection of the junction interface between the conductive adhesive layer 6 and the electrode pad 4, it is preferable that the adhesion area between the surface of the solder resist 8 and the conductive adhesive layer 6 is as wide as possible. However, if it is too wide, there is a risk of occurrence of a short circuit failure between the adjacent solder bumps 5. As the measures against this point, the area of the electrode pad 4 on the board 2 side is designed to be smaller than that of the electrode pad 3 on the semiconductor element 1 side such that the area of the conductive adhesive layer 6 is almost equal to the area of the electronic component side pad 3, whereby the short circuit failure between the adjacent bumps can be improved. In this case, the area of the board side electrode pad 4 is equal to or larger than 0.6 times the area of the electronic component side pad 3. If the area of the board side electrode pad 4 is too small, the area of a conduction portion is decreased, which results in deterioration of the conductivity. As an example for accomplishing the present structure, an opening diameter or opening area of the metal mask used for forming the conductive adhesive layer 6 is designed to be larger than that of the solder resist 8.

In general, the electronic component side pad 3 and the board side pad 4 are fundamentally formed to have almost equal areas. Assuming that each of the plane shapes of the pads 3 and 4 is formed to have a almost circular shape, the diameter of each of the pads 3 and 4 is 0.08 to 0.15 mm in a case of a bare chip, 0.15 to 0.3 mm in a case of a CSP, and 0.4 to 0.6 mm in a case of a BGA as described above.

In addition, in order to set the elastic coefficient of the conductive adhesive layer 6 to be smaller than that of the solder resist 8, it is desirable to use a silicone based resin as a base material. When the silicone based resin is used, the conductive adhesive layer 6 can be made to have low elasticity and a heat resistance against a temperature condition at solder reflowing. When comparing to the epoxy based resin, the silicone based resin is not only highly effective in reducing a stress since it has a low elastic coefficient but also has an extensible characteristic. Hence, even if the semiconductor element 1 is upsized to result in an enlargement of a thermal distortion caused by a difference in thermal expansion coefficient between the semiconductor element 1 and the board 2, the conductive adhesive layer 6 is deformed to follow the distortion such that the bump connection can be kept. With respect to this point, in the case of using the epoxy based resin, since the epoxy based resin is not extensible, the conductive adhesive layer cannot follow the enlarged thermal distortion, which may possibly result in a junction failure. Specifically, in a process of reflowing of the solder bump 5, since the thermal distortion is caused at a temperature by much higher than the glass transition temperature of the epoxy based resin, not only the strength of the epoxy based resin itself but also the adhesion strength between the conductive adhesion layer and the electrode pad 4 is deteriorated, and therefore a junction failure easily occurs. That is, as compared to the epoxy based resin, the silicone based resin having siloxane skeleton is deformable due to its extensibleness and has features of good heat resistance, good weather resistance, good chemical stability and the like in addition to that the silicone based resin can largely reduce the elastic coefficient of the conductive adhesive layer.

However, it is also effective to use a hybrid resin (mixed resin) of an epoxy based resin and a silicone based resin for the purpose of obtaining a low elastic coefficient and good extensible characteristic due to the silicone based resin and good adhesive property due to the epoxy based resin. The conductive adhesive layer 6 can be added with various metal filler (metal particles). As the material of the additive, Ag having a good conductivity is generally used, but Cu or the like can be also used. For example, a size of the particle is approximately 1 μm, and a shape thereof can be spherical or flake, but the size and the shape are not limited to those. The content of the metal filler is 50 to 90 wt % and is preferably determined in consideration of conductivity and elastic coefficient. As an example, the elastic coefficient of the conductive adhesive layer made of the silicone based resin can be low, i.e., equal to or lower than 0.1 GPa even when the metal filler is added at 80 to 85 wt %.

Next, the metal layer 7 formed on the surface of the conductive adhesive layer 6 is preferred to have a multilayer structure in which a Ni layer is formed on the surface of the conductive adhesive layer 6 and a Au layer is formed on a surface of the Ni layer. The Ni layer serves as a barrier layer that prevents a conduction failure caused by a reduction in a metal particle density in the conductive adhesive layer 6, which is caused by that the metal particles such as Ag particles contained in the conductive adhesive layer 6 are captured in Sn contained in the solder bump 5 to be lost. The thickness of the Ni layer is approximately 3 μm. The Au layer serves to keep a good wetting of the solder bump 6 and the metal layer 7 when the semiconductor element 1 and the board 2 are connected. The thickness of the Au layer is in a range of 0.02 to 0.05 μm, for example.

The metal layer 7 can be formed by an electroless plating, for example. As an important point with respect to the formation, in a state that the conductive adhesive layer 6 has been cured, a thin-film of a resin layer 12 is often formed on the surfaces of the conductive particles 11 as shown in FIG. 5A, and it is difficult to favorably form the metal layer 7 by the electroless plating. Also, even if the metal layer 7 can be formed, a good conduction cannot be obtained due to an influence of the thin film of the resin layer 12. Therefore, as shown in FIG. 5B, it is desirable to remove at least the resin layer 12 on the surfaces of the conductive particles 11 protruding from an outermost resin layer 13 so as to expose the conductive particles 11. By performing the electroless plating in this state, it is possible to cause the metal layer 7 to be adhered directly to the surfaces of the conductive particles 11 as shown in FIG. 5C, and thus, it is possible to form a strong and stable metal layer and obtain a good conduction.

In order to expose the conductive particles 11, for example, a plasma treatment with argon or oxygen under an appropriate condition is applied to the surface of the conductive adhesive layer 6, or the surface of the conductive adhesive layer 6 is immersed in acid or alkaline solution for an appropriate time. The solder bump 5 is spread to wet and cover the entire surface of the metal layer 7 to be tightly connected to the metal layer 7, and a good electrical conduction with low stress is provided between the electrode pads 3 and 4 of the semiconductor element 1 and the board 2. Moreover, as described above, since the solder bump 5 is spread to wet and cover the entire surface of the metal layer 7, a structure is provided in which only the solder bump 5 is seen in the appearance of the connecting portion between the semiconductor element 1 and the board 2 while a portion of the conductive adhesive layer 6 is hidden inside the solder bump 5 not to be seen. Hence, even in a case that flux is required to be washed after the connection of the solder bump 5, since the conductive adhesive layer 6 is covered by the solder bump 5 and is not exposed, the conductive adhesive layer 6 is prevented from being in contact with cleaning liquid and a high reliability is easily secured.

Furthermore, in such a case of the pitch of the solder bump 5 being fine, in order to protect the connecting portion of the solder bump 5, as described later, it is desirable to fill an insulating resin layer 14 in a surrounding portion of the connecting portion, i.e., a gap between the semiconductor element 1 and the board 2. As a material of the insulating resin layer 14, there may be available resins such as acrylic resin, melamine resin, epoxy resin, polyolefin resin, polyurethane resin, polycarbonate resin, polystyrene resin, polyether resin, polyamide resin, polyimide resin, fluorine resin, polyester resin, phenol resin, fluorine resin, benzocyclobutene resin, silicone resin and the like, but the insulating resin layer 14 is not limited to these materials. One of these materials or a combination of two or more of these materials can be used. The epoxy resin is often used because it is superior in view of viscosity, cost, thermal resistance, adhesion and the like. Resin is preferable which is in liquid state at a room temperature of about 25 degree Celsius. In this case, it is preferable that the elastic coefficient of the conductive adhesive layer 6 is lower than that of the insulating resin layer 19. By suppressing the elastic coefficient of the conductive adhesive layer 6 to be low as mentioned above, it is possible to suppress the stress applied to the electrode connection portion to thereby improve the connection reliability. Moreover, it is possible to adjust the thermal expansion coefficient, the elastic coefficient, the thermal property and the like of the insulating resin layer 14 by adding inorganic filler such as silica or organic filler such as acryl and silicone to the insulating resin layer 14.

As described above, in the electronic component mounting structure 10 according to the first exemplary embodiment, the semiconductor element (electronic component) provided with the electrode pad 3 and the board 2 provided with the electrode pad 4 corresponding to the electrode pad 3 are arranged such that the electrode pads 3 and 9 are opposed to each other. The solder bump 5 is formed on the surface of the electrode pad 3, and the electrode pad 3 and the electrode pad 4 are connected via the conductive adhesive layer 6 which is formed to be in contact with the solder bump 5 and the electrode pad 4. The solder resist 8 having the opening 8A regulating the area of the electrode pad 4 is formed on the surface of the board 2, and the conductive adhesive layer 6 is formed to protrude from the surface of the solder resist 8. The conductive adhesive layer 6 has an elastic coefficient lower than that of the solder resist 8, the solder bump 5 and the conductive adhesive layer 6 are connected via the metal layer 7, and the conductive adhesive layer 6 is formed to have the area larger than that of the opening 8A of the solder resist 8. Thus, since the edge 6A of the conductive adhesive layer 6 is adhered to a portion of the surface of the solder resist 8, a high stress caused by a difference in the thermal expansion coefficient between the semiconductor element 1 and the board 2 can be relieved. Hence, in case of mounting the electronic component on the board by a flip-chip connection, the connection reliability can be secured.

Figure 6A:
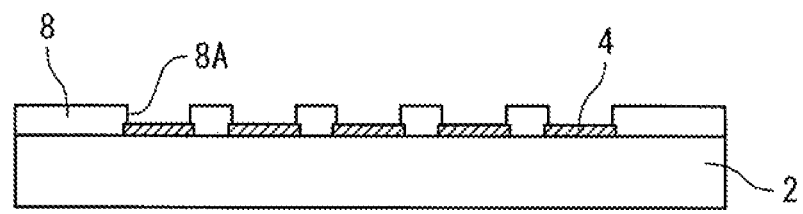
FIGS. 6A to 6C are process drawings showing a board for use in an electronic component mounting structure according to a second exemplary embodiment of the present invention and a manufacturing method thereof in the order of processes.
Figure 6B:
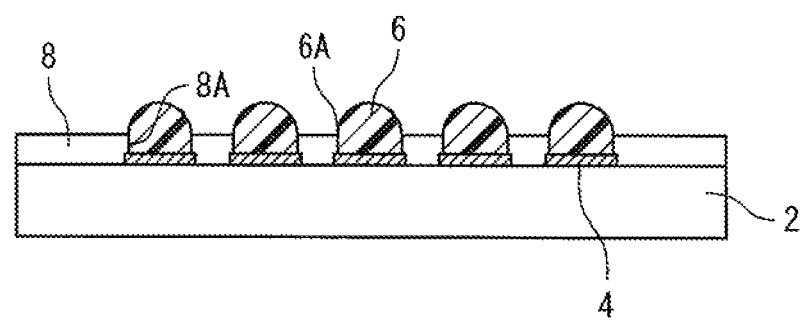
Figure 6C:
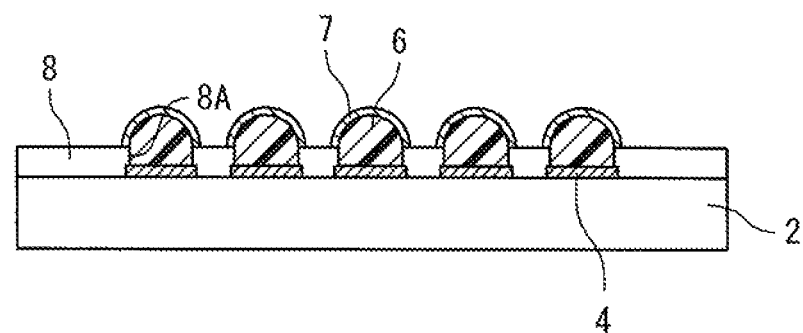

FIGS. 6A to 6C are process drawings showing a board for use in an electronic component mounting structure according to a second exemplary embodiment of the present invention and a manufacturing method thereof in the order of processes.

First, the board 2 is prepared as shown in FIG. 6A. The board 2 may be provided with the electrode pad 4 and the solder resist 8 formed thereon in advance. It is desirable to roughen the surface of the electrode pad 4 in a decree of some microns order for the purpose of improving the adhesion strength of the conductive adhesive layer 6. There is no especial limitation as to a material of the board, and a build-up board or a ceramic board may be used.

Subsequently, as shown in FIG. 6B, the conductive adhesive layer 6 is supplied onto the electrode pad 4 on the board 2 by a printing method using a metal mask. The opening area of the metal mask is designed to be larger than the area of the opening 8A of the solder resist 8. It is desirable that the edge 6A of the conductive adhesive layer 6 formed on the surface of the solder resist 8 is formed to be larger than the opening 8A of the solder resist 8 such that the portion of the conductive adhesive layer 6 is adhered to the surface of the solder resist 8. Next, the conductive adhesive layer 6 is cured at a curing condition suitable for the used conductive adhesive layer 6. An oven, a hot plate or the like can be used for curing.

Next, as shown in FIG. 6C, the metal layer 7 is formed on the surface of the conductive adhesive layer 6 by electroless plating. Here, the resin layer on the surfaces of the conductive particles on the surface of the conductive adhesive layer 6 is removed to expose the conductive particles, and thus, a formation ability of the electroless-plated layer on the surface of the conductive adhesive layer 6 is improved. The metal particles on the surface of the conductive adhesive layer 6 are exposed by applying a plasma treatment to the surface of the conductive adhesive layer 6 or immersing the surface of the conductive adhesive layer 6 in acid or alkaline solution. Since an appropriate condition of the preprocessing of the plating differs depending on the conductive adhesive layer 6 to be used, a condition of the preprocessing of the plating is required to be adjusted suitable for the conductive adhesive layer 6 to be used. Here, a preprocessing time is preferred to be as short as possible if the formation ability of the plated layer can be ensured. Thereafter, a Ni plating and a Au plating are executed in this order to thereby form the metal layer 7. Thus, the metal layer 7 can be formed by using a general electroless plating process. As described above, the board 2 according to the second exemplary embodiment for use in the electronic component mounting structure 10 shown in FIG. 3 is completed.

Thus, as for the board 2 for use in the mounting structure according to the second exemplary embodiment, it is possible to realize the mounting structure capable of relieving the stress in the connecting portion of the solder bump 5 and suitable for a fine pitch configuration of the electrode pad 4.

FIGS. 7A to 7E are process drawings showing an electronic component mounting method according to a third exemplary embodiment in the order of processes. Referring to the figures, the mounting method will be described below in the order of processes.

Figure 7A:
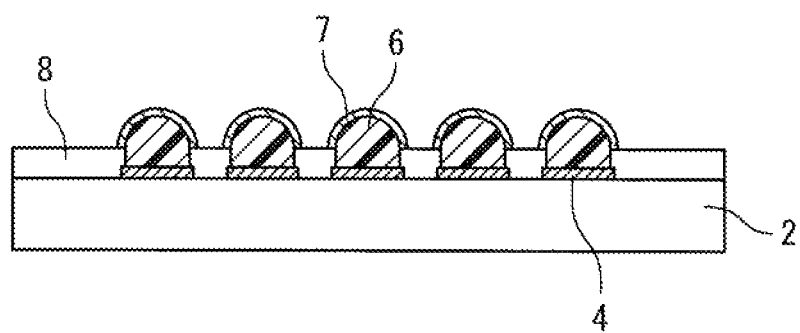
FIGS. 7A to 7E are process drawings showing an electronic component mounting method according to a third exemplary embodiment of the present invention in the order of processes.

First, as shown in FIG. 7A, the board 2 is prepared in advance by the method of FIGS. 6A to 6C, in which the conductive adhesive layer 6 is formed on the surface of the electrode pad 4 and the metal layer 7 is formed on the surface of the conductive adhesive layer 6.

Figure 7B:
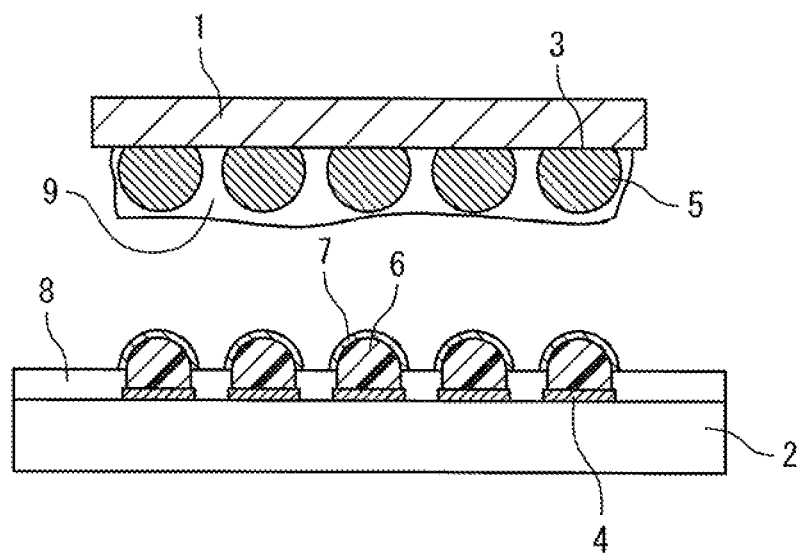

Subsequently, as shown in FIG. 7B, the semiconductor element 1 is prepared on which the solder bump 5 is formed in advance. As a method of forming the solder bump 5, there is a method in which solder paste is printed onto the electrode pad 3 by using a metal mask and flux is washed after reflowing. Alternatively, there may be a method in which a solder ball of a predetermined size is transferred onto the electrode pad 3 of the semiconductor element 1 supplied with flux by using a screen mask or the like, reflowing is performed and the flux is washed. Subsequently, the solder bump 5 is coated with flux 9. As a coating method of the flux 9, a method of transferring the solder bump 5 to the flux 9 which is formed to have a predetermined thickness by using a squeegee or the like is generally used; however, the coating method is not limited to this method. Here, although an example of coating the solder bump 5 of the semiconductor element 1 with the flux is shown, the flux may be transferred to the board 2 side.

Figure 7C:
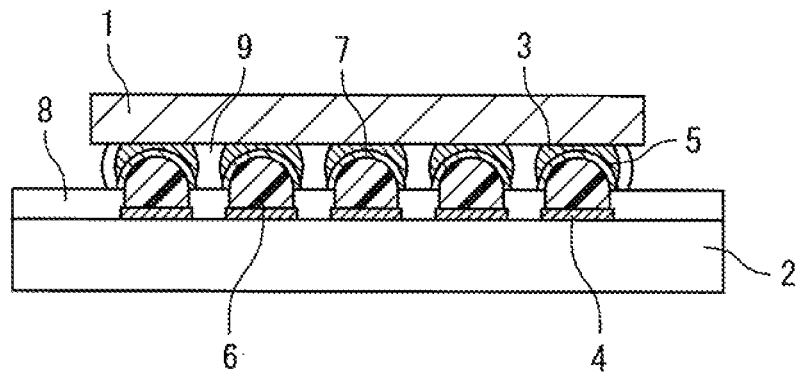

Subsequently, as shown in FIG. 7C, after performing position adjustment such that the surfaces of the electrode pads 3 of the semiconductor element 1 are opposed to the surfaces of the electrode pads 4 of the board 2, the semiconductor element 1 is mounted on the board 2, and the solder bumps 5 on the semiconductor element 1 side are melted to be spread to wet the metal layers 7 on the board 2 side, whereby the connection between the semiconductor element 1 and the board 2 is completed. Here, an entire heating with use of a reflow oven can be used as a method of reflowing the solder bumps 5; however, it is preferable to use a method in which a partial heating is performed from the semiconductor element 1 side to prevent the temperature of the board 2 from rising. By suppressing the temperature rise of the board 2 having a large thermal expansion coefficient, the thermal stress at the mounting is reduced, and thereby obtaining an assembly with less warping after the mounting and high connection reliability. Specifically, when the semiconductor element 1 is mounted on the board 2, there is available a method in which the semiconductor element 1 is heated by using a pulse heater provided to a semiconductor element mounting mounter and a mounter stage for setting the board 2 is controlled to be a temperature at least lower than that of the semiconductor element 1. In both cases of the entire heating and the partial heating, a better wettability of the solder bump is obtained by executing the reflowing in inert atmosphere such as nitrogen gas.

Figure 7D:
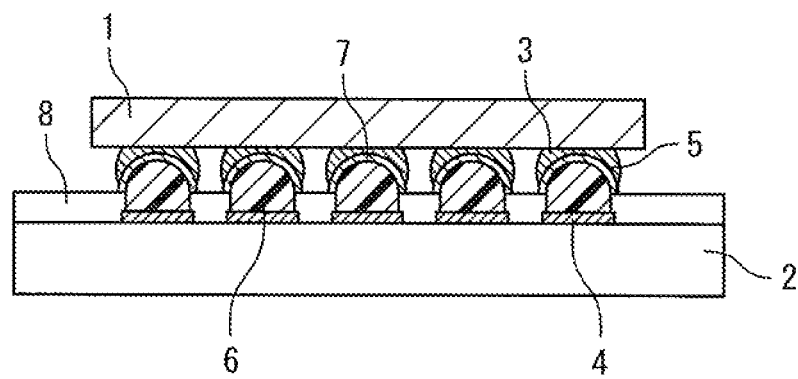

Subsequently, as shown in FIG. 7D, the flux remaining in the gap between the semiconductor element 1 and the board 2 is washed. As for the flux washing, general flux cleaning liquid (e.g., Pine Alpha manufactured by Arakawa Chemical Industries, Ltd.) for use in washing after the solder connecting is available. Since the solder bump 5 is spread to wet and cover the entire surface of the metal layer 7, a structure is provided in which only the solder bump 5 is seen in the appearance of the connecting portion between the semiconductor element 1 and the board 2 while a portion of the conductive adhesive layer 6 is hidden inside the solder bump 5. Hence, since only the solder bump 5 is brought into contact with the cleaning liquid in the connecting portion and the portion of the conductive adhesive layer 6 is not in contact with the cleaning liquid, various kinds of cleaning liquid can be used.

Figure 7E:
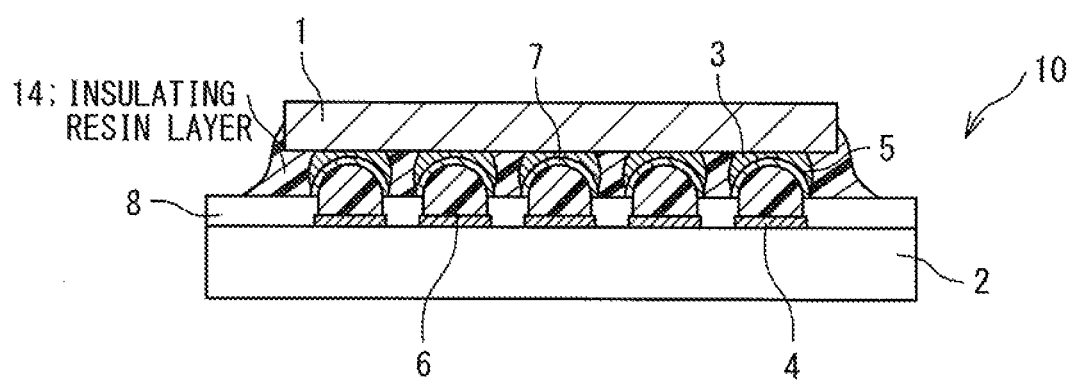

Finally, as shown in FIG. 7E, after the board 2 is sufficiently dried by a bake oven or the like, insulating resin is filled (sealed) in the gap between the semiconductor element 1 and, the board 2 by utilizing a capillary phenomenon to thereby form an insulating resin layer 14. By performing heating at 60 to 100 degree Celsius in accordance with viscosity and curing characteristics of the used insulating resin, a filling can be smoothly performed without void. After the insulating resin layer 14 is formed, the insulating resin layer 14 is cured by using an oven or the like to thereby accomplish the electronic component mounting structure 10 as shown in FIG. 3.

As described above, according to the electronic component mounting method according to the third exemplary embodiment, the electronic component mounting structure 10 with high connection reliability can be easily accomplished.

Figure 8A:
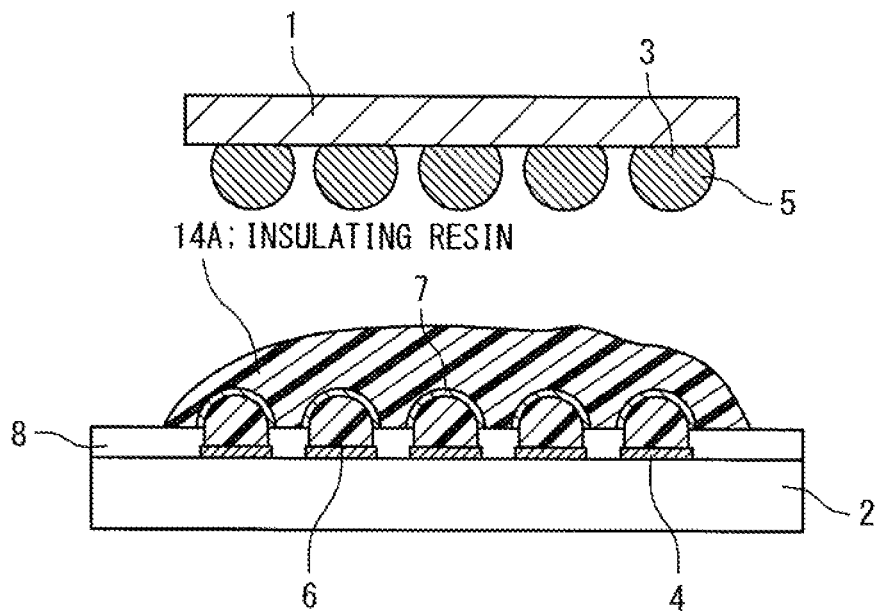
FIGS. 8A and 8B are process drawings showing an electronic component mounting method according to a fourth exemplary embodiment of the present invention in the order of processes.
Figure 8B:
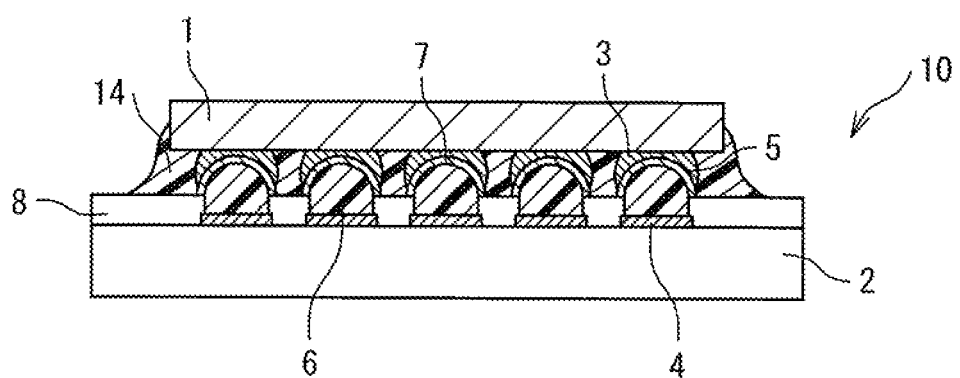

FIGS. 8A and 8B are process drawings showing an electronic component mounting method according to a fourth exemplary embodiment of the present invention in the order of processes. A remarkably different point of the electronic component mounting method according to the present exemplary embodiment from that according to the third exemplary embodiment described above is that insulating resin is supplied to the board side after the semiconductor element and the board are prepared.

In the electronic component mounting method according to the present exemplary embodiment, as shown in FIG. 8A, the semiconductor element 1 and the board 2 are prepared. The bump 5 is formed on the electrode pad 3 of the semiconductor element 1. By the method of FIGS. 6A to 6C, the conductive adhesive layer 6 is formed on the surface of the electrode pad 4 of the board 2, and the metal layer 7 is formed on the surface of the conductive adhesive layer 6. Subsequently, insulating resin 14A is supplied to the board 2 side.

Here, it is preferable that the insulating resin 14A has a function of removing an oxide film. Thus, at the connection between the solder bump 5 on the semiconductor element 1 side and the metal layer 7 on the board 2 side, an oxide film on the surface of the solder bump 5 can be removed and the connection between the solder bump 5 and the metal layer 7 can be improved. The function of removing an oxide film can be provided to the insulating resin 14A by introducing at least one of unsaturated acid such as (meta-)acrylic acid and maleic acid, organic diacid such as oxalic acid and malonic acid, or a compound in which a hydrogen atom of a side chain of a hydrocarbon is replaced by a halogen group, a hydroxyl group, a nitrile group, a benzyl group, a carboxyl group or the like. These additives of 3 to 10 wt % may be added, and alternatively, another method is available in which the oxide film is removed by using the above-described substance produced in the reaction between curing agent and main agent of epoxy resin. As a mixing ratio of the main agent and the curing agent of the epoxy resin, the curing agent of 10 to 40 wt % to the main agent of 60 to 90 wt % is preferable.

Subsequently, as shown in FIG. 8B, after performing position adjustment such that the electrode pads 3 surface of the semiconductor element 1 is opposed to the electrode pads 4 surface of the board 2, the semiconductor element 1 is mounted on the board 2. Then, the connection is performed by heating the solder bump 5 to be melted to be spread to wet the metal layer 7 of the board 2 side. Thereafter, the insulating resin 14A is cured to form the insulating resin layer 14. At this time, similarly to the process explained referring to FIGS. 7A to 7E, it is preferable to use a method in which a partial heating is performed from the semiconductor element 1 side to prevent the temperature of the board 2 from rising. The reason is same as described above. By the method mentioned above, the electronic component mounting structure 10 shown in FIG. 3 is completed.

Thus, also according to the electronic component mounting method according to the fourth exemplary embodiment, there can be obtained advantages similar to those in the third exemplary embodiment as described above, although merely different in the point that the insulating resin 14A is supplied between the electronic component 1 and the board 2 and then cured to form the insulating resin layer 19.

Although the exemplary embodiments of the present invention have been described above, the specific configuration is not limited to the exemplary embodiments, and the present invention may include the configuration with a design modification within the scope of the present invention. For example, although the exemplary embodiments are described by referring to examples in which the semiconductor element is used as the electronic component, the electronic component is not limited to this and the invention can be similarly applied to other elements including a passive element such as a capacitor, an inductor and the like. Moreover, for the brazing material protruding portion, any material can be selected among the various kinds of materials exemplified in the exemplary embodiments in accordance with a purpose. In addition, although the shapes of the electronic component side electrode pad and the board side electrode pad are described by using examples in which the planer shapes of those are formed in almost circular shapes, the shapes are not limited to these examples and can be selected as other arbitrary shapes such as ellipse.

What is claimed is:

1. An electronic component mounting structure comprising:
    an electronic component including a first electrode pad and a brazing material protruding portion formed on said first electrode pad; and
    a board including a second electrode pad arranged correspondingly to said first electrode pad and a conductive material portion formed on said second electrode pad,
    wherein said first electrode pad and said second electrode pad are connected via said brazing material protruding portion and said conductive material portion,
    solder resist is formed on a surface of said board,
    said second electrode pad is defined by an opening portion of said solder resist,
    said conductive material portion, which is adhered to said solder resist, protrudes from a surface of said solder resist, and
    an elastic coefficient of said conductive material portion is lower than an elastic coefficient of said solder resist.

2. The electronic component mounting structure according to claim 1, wherein said brazing material protruding portion and said conductive material portion are connected via a metal layer.

3. The electronic component mounting structure according to claim 2, wherein said conductive material portion includes a resin layer and a conductive particle.

4. The electronic component mounting structure according to claim 3, wherein at least said conductive particle protruding from an outermost surface of said resin of said conductive material portion is directly adhered to said metal layer at a surface of said conductive material portion in contact with said metal layer.

5. The electronic component mounting structure according to claim 3, wherein said resin layer includes a silicone based resin layer.

6. The electronic component mounting structure according to claim 3, wherein said resin includes a mixture of silicone based resin and epoxy based resin.

7. The electronic component mounting structure according to claim 2, wherein said metal layer includes at least a Ni layer.

8. The electronic component mounting structure according to claim 2, further comprising an insulating resin layer filled between said electronic component and said board.

9. The electronic component mounting structure according to claim 8, wherein an elastic coefficient of said conductive material portions is lower than an elastic coefficient of said insulating resin layer.

10. The electronic component mounting structure according to claim 1, wherein said conductive material portion is formed to have an area larger than an area of said opening of said solder resist, and
    an edge of said conductive material portion is adhered to a portion of said surface of said solder resist.

11. The electronic component mounting structure according to claim 1, wherein a conductive adhesive layer of said conductive material portion includes silicone resin.

12. The electronic component mounting structure according to claim 1, wherein a surface of said second electrode pad in contact with said conductive material portion is roughened.

13. The electronic component mounting structure according to claim 1, wherein said brazing material protruding portion includes a solder bump.

14. An electronic component mounting method for mounting an electronic component with a first electrode pad on a board with a second electrode pad, comprising:
   forming a brazing material protruding portion on said first electrode pad;
   forming solder resist on a surface of said board, wherein a plane size of said second electrode pad is defined by an opening of said solder resist;
   forming a conductive material portion such that said conductive material portion is in contact with said second electrode pad, is adhered to said solder resist and protrudes from a surface of said solder resist, wherein said conductive material portion is lower than said solder resist in elastic coefficient; and
   connecting said brazing material protruding portion to said conductive material portion by arranging said electronic component on said board and melting said brazing material protruding portion.

15. The electronic component mounting method according to claim 14, further comprising forming a metal layer on a surface of said conductive material portion after said forming said conductive material portion,
   wherein said brazing material protruding portion is connected to said metal layer when said brazing material protruding portion is melted.

16. The electronic component mounting method according to claim 15, wherein said conductive layer material includes a resin layer and a conductive particle, and
   said brazing material protruding portion is connected to said metal layer and said conductive particle when said brazing material protruding portion is melted.

17. The electronic component mounting method according to claim 15, further comprising filling insulating resin into a gap between said electronic component and said board by using capillary phenomena after melting said brazing material.

18. The electronic component mounting method according to claim 15, wherein a temperature of said electronic component is kept lower than a temperature of said board.

19. An electronic component mounting board for mounting an electronic component, comprising:
   a board provided with an electrode pad;
   solder resist which has an opening defining said second electrode pad and is formed on said board; and
   a conductive material portion formed to be in contact with said second electrode pad, be adhered to said solder resist and protrude from a surface of said solder resist,
   wherein an elastic coefficient of said conductive material portion is lower than an elastic coefficient of said solder resist.

20. The electronic component mounting board according to claim 19, wherein a metal layer is formed on a surface of said conductive material portion.

* * * * *